United States Patent [19]

Andersen

[11] 4,325,009
[45] Apr. 13, 1982

[54] DEVICE FOR DISPLAYING AN ANALOG SIGNAL ON A DISPLAY SCREEN

[75] Inventor: Henning H. Andersen, Albertlund, Denmark

[73] Assignee: U.S. Philips Corporation, New York, N.Y.

[21] Appl. No.: 156,895

[22] Filed: Jun. 5, 1980

[30] Foreign Application Priority Data

Jun. 6, 1979 [NL] Netherlands ................. 7904430

[51] Int. Cl.$^3$ .................................... H01J 29/52
[52] U.S. Cl. ............................................ 315/386
[58] Field of Search ................. 315/30, 383, 386, 393

[56] References Cited

U.S. PATENT DOCUMENTS 3,772,679 11/1973 Scheer ................. 340/347 AD

*Primary Examiner*—Theodore M. Blum

*Attorney, Agent, or Firm*—Thomas A. Briody; William J. Streeter; Edward W. Goodman

[57] ABSTRACT

A device for displaying an analog signal on a display screen which is scanned by means of a line deflection generator and a frame deflection generator. The device comprises a signal processing device for forming a processed signal by repeating the analog signal at the line deflection frequency, a reference voltage generator for generating a reference voltage which is dependent on the frame deflection voltage, and a comparator for comparing the reference voltage and the processed signal and for generating a control signal which causes a brightening of the scanned display screen when both signals are approximately equal. In order to improve the picture quality, the device comprises means for adding a varying auxiliary signal to the processed signal. The frequency of this auxiliary signal amounts to at least ten times the line deflection frequency.

4 Claims, 3 Drawing Figures

DEVICE FOR DISPLAYING AN ANALOG SIGNAL ON A DISPLAY SCREEN

The invention relates to a device for displaying an analog signal on the display screen of a cathode ray tube, comprising a line deflection generator and a frame deflection generator for scanning the display screen in a line raster pattern, a signal processing device which is arranged to form a processed signal by repeating the analog signal at the frequency of the line deflection generator, a reference voltage generator for generating a reference voltage whose value is dependent on the output voltage of the flame deflection generator, a comparator for comparing the processed signal with the reference voltage, the output voltage thereof being applied as a control signal to a beam intensity control device for the selective brightening of the scanned display screen.

In a device of this kind (see e.g. U.S. Pat. No. 3,772,679) the analog signal is displayed by causing the scanned display screen to brighten whenever the value of the signal corresponds approximately to that represented by the position on the display screen of the line being scanned at the relevant instant. As a result, the signal is displayed on the display screen as a series of horizontal, line-shaped bright elements which, in the eyes of an observer, appear to combine to form an uninterrupted curve. However, if the signal contains components which vary comparatively slowly, so that the curve on the display screen has a small slope, these elements will be comparatively long and the display will no longer give the impression of a smooth curve, but rather that of a stepped curve.

The invention has for its object to provide a device in which a slowly varying analog signal is (can be) displayed so as to resemble a smooth curve, without high additional cost.

To achieve this, the device in accordance with the invention is characterized in that it comprises means for adding a periodically varying auxiliary signal to the processed signal, the frequency of said auxiliary signal amounting to at least ten times the frequency of the line deflection generator.

The invention is based on the recognition of the fact that a stepped curve gives the impression of being smooth when the brightness of the horizontal elements decreases from the centre in the direction of the extremities. This could be realized per se by utilizing brightness modulation, so that a continuous scale of grey tones can be displayed, but this method requires comparatively expensive equipment. The steps proposed in accordance with the invention can be realized with very simple, inexpensive means and provide visually the same result.

When the analog signal varies quickly, the adverse effect to be reduced by means of the invention, will not be present. In order to prevent the relevant part of the curve from being displayed on the display screen as being somewhat irregular, a preferred embodiment of the device in accordance with the invention is characterized in that there are provided means for determining the rate of change of the processed signal, and also means for preventing the auxiliary signal from being added to the processed signal when the rate of change exceeds a predetermined value.

The invention will be described in detail hereinafter with reference to the accompanying diagrammatic drawing.

Figure 1:
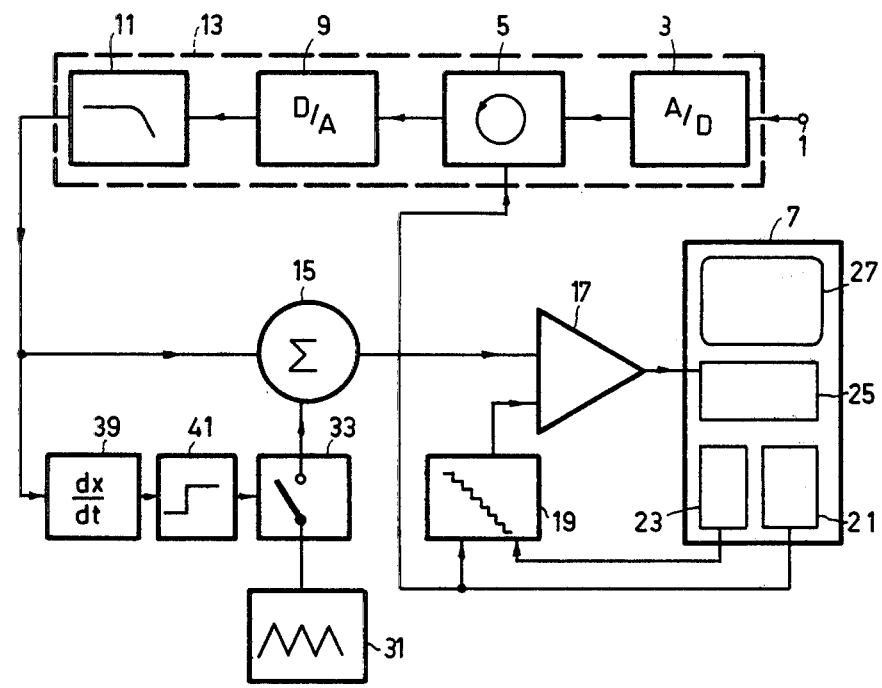
FIG. 1 shows a block diagram of a device in accordance with the invention.

The device which is shown diagrammatically in FIG. 1 comprises an input 1 which can receive an analog signal, for example, a physiological measurement voltage. This input is connected to an analog-to-digital converter 3 which produces a digital representation of the signal. These digital values are stored in a memory 5 which is read at a frequency which equals the line deflection frequency of an image display device 7 (generally 15 kHz). After having been read, the signal passes through a digital-to-analog converter 9 and a filter 11, on the output of which a processed signal appears which is an input signal representation repeated at the line deflection frequency.

The network formed by the analog-to-digital converter 3, the memory 5, the digital-to analog converter 9 and the filter 11 constitutes a signal processing device 13 which is known per se.

The processed signal is applied, via a summing device 15, to an input of a comparator 17, the other input of which is connected to the output of a reference voltage generator 19. This reference voltage generator is connected to the line deflection generator 21 and the frame deflection generator 23 of the image display device 7. It produces a reference voltage which is dependent on the output voltage of the frame deflection generator 23, for example, a squarewave voltage whose value is, during one period of the line deflection generator 21, constant and proportional to the voltage supplied by the frane deflection generator. The line deflection generator 21 is also connected to the memory 5 in order to synchronize the read frequency thereof with the line deflection frequency.

The comparator 17 continuously compares the value of the processed signal with the value of the reference voltage and supplies an output control signal if these values are equal within given limits. This control signal is applied to a beam intensity control device 25 which forms part of the image display device 7 and which serves for the selective suppression of the electron beam in the cathode ray tube of the image display device, so that the display screen 27 of the tube us brightened during the presence of the control signal.

Figure 2:
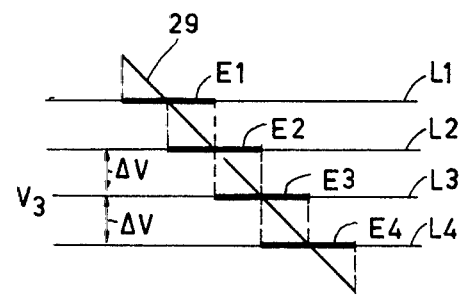
FIG. 2 shows a part of the display on a display screen of the device in order to illustrate the method of displaying a signal.

FIG. 2 shows, on an enlarged scale, a part of the display screen 27 with four image lines L1 to L4 on which a part of an analog signal, represented by a line 29, is displayed. The comparator 17 is arranged so that it supplies a control signal when the difference between the two signals on its inputs does not exceed a voltage $\Delta V$ which corresponds to the distance between two adjacent lines on the display screen. When writing the line L3, for example, the reference voltage generator 19 supplies a voltage V3 and the scan on the display screen 27 is brightened for as long as the processed signal equals $V3 \pm \Delta V$. As a result, a pixel E3 is written on the display screen 27. Similarly, the pixels E1, E2 and E4 are written during the scanning of the lines L1, L2 and L4, respectively. When these pixels are observed at the normal viewing distance, they appear to give the impression of a smooth curve which corresponds to the line 29. It will be immediately apparent from FIG. 2 that the pixels will be longer when the curve 29 is less steep, that is to say when the analog signal varies less quickly. Consequently a slowly varying signal thus displayed will appear to the eye of an observer as a stepped curve, and this may be a disturbing effect.

In order to eliminate this drawback, the device shown in FIG. 1 is provided with an auxiliary generator 31 which generates a periodically varying auxiliary signal, for example, a sawtooth signal, the frequency of which is high with respect to the line deflection frequency, that is to say at least ten times higher and preferably approximately five hundred times higher. This auxiliary signal is applied via a switching device 33 to the summing device 15 in which it is combined with the processed signal. The first input of the comparator 17 then receives the sum of the processed signal and the auxiliary signal.

Figure 3:
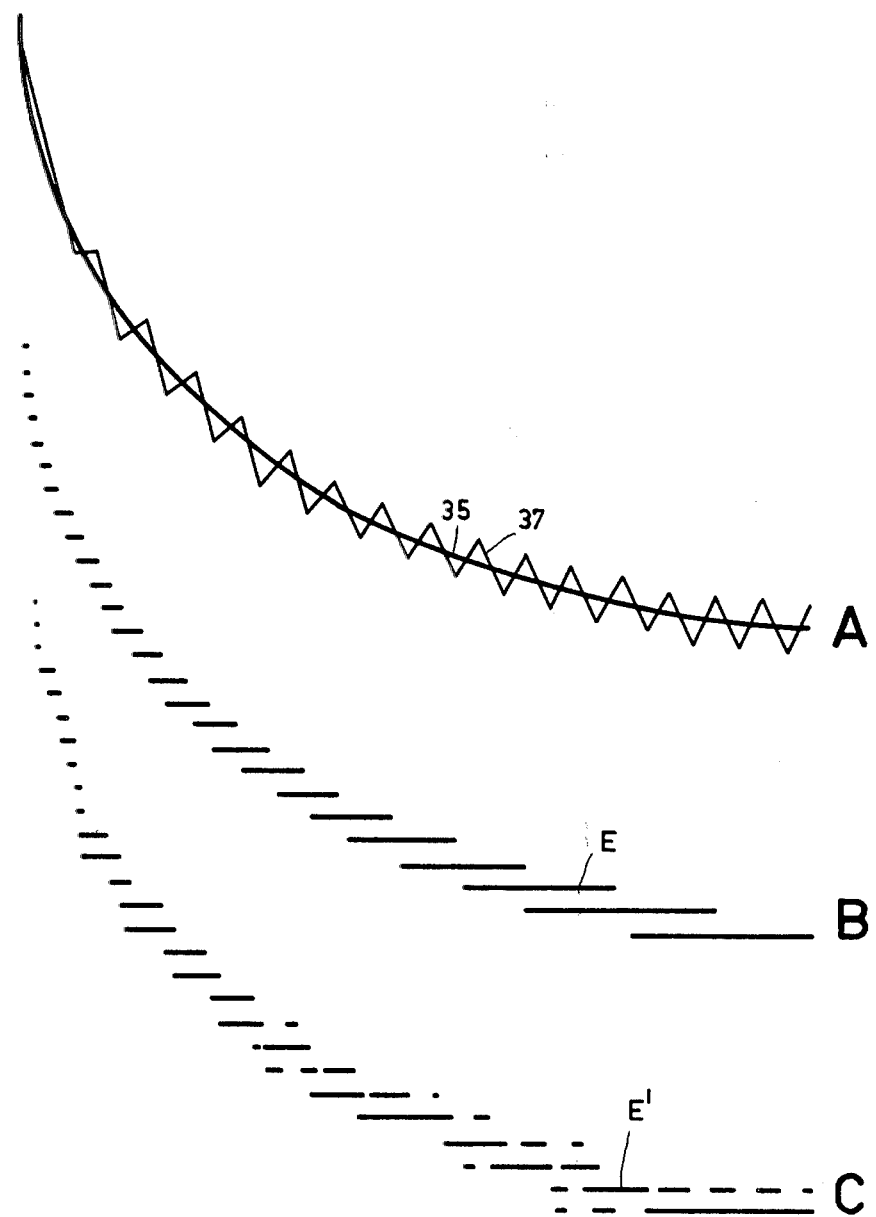
FIG. 3 is a diagram which illustrates the effect of applying the steps defined in accordance with the invention.

The effect thereof is shown in FIG. 3. At A a curve 35 is shown which corresponds to an analog signal. If the curve 35 is displayed by means of the method described with reference to FIG. 2 without adding the auxiliary signal, the image shown at B will be produced on the display screen 27. As has already been explained, the pixels E constituting this image will become longer as the curve 35 becomes less steep.

At A there is also shown a curve 37 which corresponds to the sum of the analog signal and the auxiliary signal. It can readily be seen that a representation of this curve 37 in accordance with FIG. 2 will produce an image as shown at C. Where the original curve 35 is least steap, the pixels E1 are broken and consist of a central portion which is substantially shorter than the corresponding pixel in the representation shown at B and of a number of even shorter end portions. It will appear to the eye of an observer that the end portions contribute substantially less to the total impression of the image than the central portion, so that the eye will interpret the image shown at C as a substantially better approximation of the curve 35 than the image shown at B.

However, FIG. 3 also shows that steep parts of the curve 35 (at the left in the Figure) are shown less smoothly at C than at B. In a more refined embodiment of the device in accordance with the invention, therefore, the auxiliary signal is added only when the curve 35 is not steep, that is to say when the rate of change of the processed signal does not exceed a predetermined value.

Therefore, as is shown in FIG. 1, the processed signal is also applied to a differentiator 39 which determines the time derivative. The absolute value of the derivative is applied to a threshold discriminator 41 which preferably has an adjustable threshold value. When the value of the derivative exceeds this threshold value, the switching device 33 is controlled so that the auxiliary signal does not reach the summing device 15. If this refinement is not required, the differentiator 39, the threshold discriminator 41 and the switching device 33 may be omitted.

Instead of being sawtooth-shaped or delta-shaped, as in the described embodiment, the auxiliary signal may have any other suitable shape, for example, it may be sinusoidal. The amplitude of the auxiliary signal preferably amounts to the value $\Delta V$ which corresponds approximately to the distance between two picture lines which are situated one directly above the other. A substantially lower amplitude would not have the desired effect, whilst a substantially higher value (for example, $10\Delta V$) would cause a very jittery picture.

What is claimed is:

1. A device for displaying an analog signal on the display screen of a cathode ray tube, comprising a line deflection generator and a frame deflection generator for scanning the display screen in a line raster pattern, a signal processing device which is arranged to form a processed signal by repeating the analog signal at the frequency of the line deflection generator, a reference voltage generator for generating a reference voltage whose value is dependent on the output voltage of the frame deflection generator, a comparator for comparing the processed signal with the reference voltage, the output voltage thereof being applied as a control signal to a beam intensity control device for the selective brightening of the scanned display screen, characterized in that the device comprises means (31, 15) for adding a periodically varying auxiliary signal to the processed signal, the frequency of said auxiliary signal amounting to at least ten times the frequency of the line deflection generator (21).

2. A device as claimed in claim 1, characterized in that there are provided means (39) for determining the rate of change of the processed signal and also means (41, 33) for preventing the auxiliary signal from being added to the processed signal when the rate of change exceeds a predetermined value.

3. A device as claimed in claim 1 or 2, characterized in that the auxiliary signal is sawtooth-shaped.

4. A device as claimed in claim 1 or 2, characterized in that the auxiliary signal has a sinusoidal shape.

* * * * *